United States Patent
Rouge et al.

(10) Patent No.: US 10,295,595 B2
(45) Date of Patent: May 21, 2019

(54) SYSTEM AND METHOD FOR TESTING AND CONFIGURATION OF AN FPGA

(71) Applicant: MENTA, Montpellier (FR)

(72) Inventors: Laurent Rouge, Le Cres (FR); Julien Eydoux, Montpellier (FR); Marcello Giuffre, Antibes (FR)

(73) Assignee: MENTA, Montpellier (FR)

( * ) Notice: Subject to any disclaimer, the term of this patent is extended or adjusted under 35 U.S.C. 154(b) by 0 days.

(21) Appl. No.: 15/540,997

(22) PCT Filed: Oct. 7, 2016

(86) PCT No.: PCT/EP2016/074076
§ 371 (c)(1),
(2) Date: Jun. 29, 2017

(87) PCT Pub. No.: WO2017/063957
PCT Pub. Date: Apr. 20, 2017

(65) Prior Publication Data
US 2018/0275193 A1   Sep. 27, 2018

(30) Foreign Application Priority Data
Oct. 15, 2015  (EP) .................................. 15306641

(51) Int. Cl.
*G01R 31/28*  (2006.01)
*G01R 31/3177*  (2006.01)
(Continued)

(52) U.S. Cl.
CPC ......... *G01R 31/3177* (2013.01); *G01R 31/28* (2013.01); *G01R 31/31701* (2013.01);
(Continued)

(58) Field of Classification Search
None
See application file for complete search history.

(56) References Cited

U.S. PATENT DOCUMENTS

| 5,027,355 A | 6/1991 | Stoica |
| 5,432,441 A | 7/1995 | El-Ayat et al. |

(Continued)

FOREIGN PATENT DOCUMENTS

WO   2012/123243 A1   9/2012

OTHER PUBLICATIONS

Victor Olubunmi Aken'Ova, "Bridging the Gap between Soft and Hard eFPGA Design," Thesis, The University of British Columbia, Chapter 3.22, Mar. 2005 <https://www.ece.ubc.ca/~lemieux/publications/akenova-masc2005.pdf>.

*Primary Examiner* — Mujtaba M Chaudry
(74) *Attorney, Agent, or Firm* — Baker & Hostetler LLP

(57) ABSTRACT

Configuration values for Lookup tables (LUTs) and programmable routing switches in an FPGA are provided by means of a number of flip flops arranges in a shift register. This shift register may receive test values in a factory test mode, and operational configuration values (implementing whatever functionality the client requires of the FPGA) in an operational mode. The bitstreams are provided at one end of the shift register, and clocked through until the last flip flop receives its value. Values may also be clocked out at the other end of the shift register to be compared to the initial bitstream in order to identify corruption of stored values e.g. due to radiation exposure. A clock gating architecture is proposed for loading data to or reading data from specific selected shift registers.

8 Claims, 11 Drawing Sheets

(51) Int. Cl.
*H03K 19/177* (2006.01)
*G01R 31/317* (2006.01)
*G11C 19/28* (2006.01)
*H03K 3/037* (2006.01)

(52) U.S. Cl.
CPC ........ *G01R 31/31727* (2013.01); *G11C 19/28* (2013.01); *H03K 3/037* (2013.01); *H03K 19/1774* (2013.01); *H03K 19/17728* (2013.01); *H03K 19/17764* (2013.01)

(56) References Cited

U.S. PATENT DOCUMENTS

| | | | |
|---|---|---|---|
| 5,675,589 A | 10/1997 | Yee | |
| 6,021,513 A | 2/2000 | Beebe et al. | |
| 6,215,327 B1* | 4/2001 | Lyke | H03K 19/17796 326/10 |
| 7,111,214 B1* | 9/2006 | Chaudhary | G06F 11/263 326/39 |
| 7,463,056 B1 | 12/2008 | Anderson et al. | |
| 8,040,152 B1* | 10/2011 | Han | H03K 19/177 326/38 |
| 8,091,001 B2 | 1/2012 | Yao et al. | |
| 2007/0190952 A1* | 8/2007 | Waheed | H04B 1/0475 455/114.3 |
| 2008/0133988 A1 | 6/2008 | Yao et al. | |
| 2011/0069970 A1* | 3/2011 | Fein | H03M 7/40 398/141 |

\* cited by examiner

SYSTEM AND METHOD FOR TESTING AND CONFIGURATION OF AN FPGA

CROSS-REFERENCE TO RELATED APPLICATIONS

This application is a National Stage of International patent application PCT/EP2016/074076, filed on Oct. 7, 2016, which claims priority to foreign European patent application No. EP 15306641.0, filed on Oct. 15, 2015, the disclosures of which are incorporated by reference in their entirety.

FIELD OF THE INVENTION

The present invention relates to programmable logic devices, and more particularly to field programmable gate array devices.

BACKGROUND OF THE INVENTION

FPGAs are a type of Programmable Logic Device. They are generally based on a standard programmable Logic Block, a large number of which are arranged together to implement various functions.

FIG. 1 shows schematically an example of an FPGA system as known in the state of the art.

As shown in FIG. 1, an FPGA chip 10 comprises a number of Logic Blocks 11, for example as described above. The chip also comprises a number of input/output ports 12. Connecting these logic blocks 11 and input/output ports 12 are a number of tracks 14. At junction points of these tracks are provided and number of programmable routing areas 13. In these programmable routing areas there are provided switches which can selectively connect any pair of intersecting tracks, under the control of a logical value stored in a memory cell connected with each switch. The switch memory values are set at system start up from a non volatile memory. Accordingly, by setting the values in the switch memories as required, any connections of any Logic Block can be coupled to those of any other Logic Block, or any input/output port 12. Thus, by properly configuring the memory units to define the operation of each logic block, and the switch memories 13 to establish appropriate connections between the logic blocks, any desired functionality can be implemented.

FIG. 2 shows further detail of elements of an FPGA system as known in the state of the art.

The elements shown in FIG. 2 constitute a representative example of a partial implementation of parts of the functionality described above with respect to FIG. 1.

As shown in FIG. 2, there is provided a first Look Up Table (LUT) 21, and a second Look Up Table (LUT) 22, and a number of further LUTs (not shown). The first LUT 21 comprises seven two input multiplexers 211, 212, 213, 214, 215, 216, 217 respectively. The second LUT and further LUTs are configured similarly. These multiplexers are arranged in a cascading manner with three rows so as to constitute an 8 input multiplexer, the output of which constitutes the output of the LUT. The first row of multiplexers (211, 213, 215 and 217) in each cascade arrangement both have a total of eight inputs. These eight inputs constitute the programming inputs of the first LUT 21. The selection inputs of each row are ganged together, to constitute the three data inputs of the LUT. The data inputs and data output of the first LUT are connected to a set of tracks 2501, 2502. The inputs and outputs of the second and further LUTs are connected correspondingly to a network of further tracks (not shown). Conventionally a LUT with 3 data inputs in this manner is referred to as a "LUT3". Each of the eight programming inputs of the first LUT 21 connected to a respective Static RAM memory device 251, 252, 253, 254, 255, 256, 257, 258. Corresponding Static RAM memory devices provide the configuration inputs of the second LUT 22, and the other LUTs provided in the system (not shown). In operation, these memory devices 251, 252, 253, 254, 255, 256, 257, 258 provides a constant predetermined logical value to each of the eight programming inputs of each LUT. The content of each SRAM cell is shown schematically as comprising a latch built of two inverters, each receiving the output of the other, with a transistor switch, switched by a word line 23, provided to enable the selective output of the value on the output of one of the inverters in the latch to a bit line connected to a respective configuration input of the LUT 217, and also to a data line 24 by means of which the value of the latch may be set. The bit line of each memory device 251, 252, 253, 254, 255, 256, 257, 258 is connected to a selection bus 24, and the word line of each memory device 251, 252, 253, 254, 255, 256, 257, 258 is connected to a data bus 23. During an initiation phase for the circuit, each memory device 251, 252, 253, 254, 255, 256, 257, 258 is addressed in turn, and the desired value set to the latch in question. The logical behaviour of the LUT is response to any binary value on its three data inputs can thus be defined as required. This is the underlying basic concept of FPGA technology. It will be appreciated however that the functions that a single Logic block comprising two LUT3s can implement is limited, however by interconnecting a number of suitably configured LUTs as described above, any arbitrary combinatorial function can be implemented. This interconnection is achieved through a programmable interconnection of the data channels 2501, 2502, and further channels (not shown) carrying data from other LUTs. As shown whilst channels 2501, 2502 are arranged vertically, there is provided a further channel 2503 intersecting channels 2501, 2502. At the intersection of respective lines of channels 2501 and 2503 is provided a programmable switching unit 26. Considering that the intersection of the two lines constitutes a total of four connections at the switching unit, the switching unit comprises 6 transistor switches, arranged to make or break a connection between any two of these four connections. Each of these transistor switches is set to be open or closed by a value received from a respective static memory unit 261, 262, 263, 264, 265, 266. Further such programmable switching units, with corresponding static memory devices are provided at many or all intersection of tracks (not shown). These static memory devices 261, 262, 263, 264, 265, 266 as shown are identical to the memory devices 251, 252, 253, 254, 255, 256, 257, 258, and connected to the same address and data busses 23 and 24, so that when during an initiation phase for the circuit, both the LUT memory devices and switch memory devices may be addressed in turn, and the desired value set to the latch in question, so that the behaviour of each LUT, and its connections to any other LUT may be configured as required.

WO2012/123243 A1, U.S. Pat. Nos. 7,463,056 B1, 6,021, 513 A, 5,432,441 A, 8,091,001 B2, 5,675,589 A, and 5,027, 355 A describe certain aspects of the foregoing.

The article entitled "Bridging the Gap between Soft and Hard eFPGA Design", by Victor Olubunmi Aken'Ova chapter 3.22 available from https://www.ece.ubc.ca/~lemieux/publications/akenova-masc2005.pdf provides further background information.

While the approach described is highly flexible, it will be appreciated that the interconnection tracks between LUTs and the Address and data busses of the memory units take a significant amount of space. Even in the highly simplified arrangement of FIG. 2 the number of lines shown is substantial, and this quickly becomes onerous in any real implementation. This is further exacerbated by the need to implement testing functionality in the circuit, provided to confirm proper behaviour when the device is manufactured, which will require the addition of still further features.

SUMMARY OF THE INVENTION

According to a first aspect there is provided a Field Programmable Gate Array capable of implementing a logic function said Field Programmable Gate Array comprising a plurality of hardware lookup tables, the select lines or outputs of each lookup table being programmably interconnected with select lines or outputs of another said lookup table by means of a plurality of programmable switches, This Field Programmable Gate Array is characterized by further comprising a plurality of flip flops in a shift register configuration and constituting a programming shift register, each Lookup table having at least one input coupled to an output of a respective said flip flop, and each said programmable switch coupled to an output of a further respective said flip flop; and wherein said Field Programmable Gate Array is arranged to operate in a first mode in which said programming shift register is loaded with predefined test values, and a second mode in which said programming shift register is loaded with values implementing said logic function.

Programming the FPGA by means of a programming shift register reduces the space of the chip dedicated to addressing memory cells, and improves testability by scan chain techniques, in particular with industrial scale production targets.

According to a development of the first aspect, the first flip flop in the programming shift register is coupled to an input multiplexer receiving the predefined test values on a first input and said values implementing said logic function a second input, and responsive to a mode selection signal adapted to feed either the test pattern or the data bitstream to said first flipflop.

This means that certain physical resources can be shared between two functionalities, without increasing surface area.

According to a further development of the first aspect the programming shift register is one of a plurality of such programming shift registers configured to supply different parts of said Field Programmable Gate Array.

Multiple programming shift registers increase flexibility in testing due to possibility of adopting a modular approach for organization into a scan chain, and reduces power consumption due to fewer flips flops being clocked at any time.

According to a further development of the first aspect the plurality of programming shift registers are configured to be loaded with said predefined test values in said first mode or said values implementing said logic function in said second mode in parallel.

Loading multiple programming shift registers in parallel can reduce initialization time, and constrain total power consumption due to sharing of clock signals.

According to a further development of the first aspect the plurality of programming shift registers are configured to be loaded with said predefined test values in said first mode or said values implementing said logic function in said second mode in series.

Loading the multiple programming shift registers in series can simplify programming, and constrain total power consumption.

According to a further development of the first aspect the Field Programmable Gate Array further comprises an addressing system whereby any of said plurality of programming shift registers may be individually or by group addressed in order to be loaded with said predefined test values in said first mode or said values implementing said logic function in said second mode.

The possibility of individually or by group addressing programming shift registers increases flexibility, and reduces initialization time and power consumption due to the possibility of addressing only those programming shift registers actually required for a specific application.

According to a further development of the first aspect the addressing system comprises a respective addressable clock gate associated with each programming shift register or group, the clock gate being adapted to provide a clock signal to the programming shift register with which it is associated when thus addressed.

Controlling addressing by means of the clock reduces power consumption by restricting clock propagation.

According to a further development of the first aspect the Field Programmable Gate Array is further adapted to implement a third mode of operation in which the values implementing the logic function loaded into the programming shift registers in the second mode of operation are read back out of the programming shift registers for comparison with the values implementing the logic function loaded for the second mode.

The possibility of comparing the initial configuration bitstream with the actual configuration in the flip flops after an operational phase provides the means for detecting erroneous results due to corruption of configuration values, for example in aerospace, military or nuclear industry applications.

According to a second aspect there is provided a method of operating an FPGA comprising the steps of instructing a multiplexer having an output coupled to a programming shift register to select an input receiving configuration values implementing a test protocol and instructing a plurality of LUT flip flops to enter a test configuration wherein each said LUT flip flop receives inputs implementing said test protocol, and wherein said LUT flip flops are connected as a shift register. The programming shift register is then clocked to load a first set of elements thereof with LUT Configuration values belonging to said configuration values implementing said test protocol and a second set of elements of said shift register with routing switch Configuration belonging to said configuration values implementing said test protocol. The plurality of LUT flip flops is then instructed to enter an operational configuration wherein each said LUT flip flop receives inputs from the outputs of a plurality of LUTs respectively, and data inputs are then applied to the plurality of LUTs. The LUT flipflops are then clocked to sample the outputs of each said LUT into a respective said flipflop, the outputs being responsive to said test protocol and said data inputs. The LUT flip flops are then instructed to enter a test configuration in which the LUT flip flops are connected in a LUT shift register, and connected as a shift register, and clocked to read out the values of said LUT shift register comprising said outputs of said LUTs responsive to said test protocol and said data inputs.

According to a third aspect there is provided a method of operating an FPGA comprising the steps of instructing a multiplexer having an output coupled to a programming flip flop to select an input receiving configuration values implementing a logic function, and instructing said plurality of LUT flip flops to enter an operational configuration wherein each said LUT flip flop receives inputs from the outputs of a LUT respectively. The method then proceeds to clock the programming shift register to load a first set of elements thereof with LUT Configuration values belonging to said configuration values implementing said logic function, and to load a second set of elements of said shift register with routing switch configuration belonging to said configuration values implementing said logic function.

According to a development of the third aspect the method comprises the further steps of enabling the output of a first programming shift register as said programming shift register, and repeating the steps of clocking and instructing for further said programming shift registers.

According to a fourth aspect there is provided a method of operating an FPGA comprising the steps of clocking a first programming shift register to read out a first set of elements thereof with the LUT Configuration values implementing a logic function, and to read out a second set of elements of said shift register with routing switch Configuration implementing a logic function.

According to a development of the fourth aspect the method comprises the further steps of enabling the output of a first programming shift register as said programming shift register, and repeating the steps of clocking for further programming shift registers.

According to a further development of the fourth aspect the method comprises the further step of comparing the LUT Configuration implementing a logic function and routing switch Configuration implementing a logic function as read out of the programming shift register with a LUT Configuration implementing a logic function and routing switch Configuration a implementing logic function as originally written into the shift register.

According to a fifth aspect of the invention there is provided a computer program adapted to implement the steps of the method of the second or third aspect.

Implementing the method in a computer program provides a convenient mechanism for interfacing with the FPGA and implementing the invention in a flexible and standardized platform.

According to a sixth aspect of the invention there is provided a computer readable medium incorporating the computer program of the fifth aspect.

BRIEF DESCRIPTION OF THE DRAWINGS

The above and other advantages of the present invention will now be described with reference to the accompanying drawings, in which.

DETAILED DESCRIPTION

Figure 3:
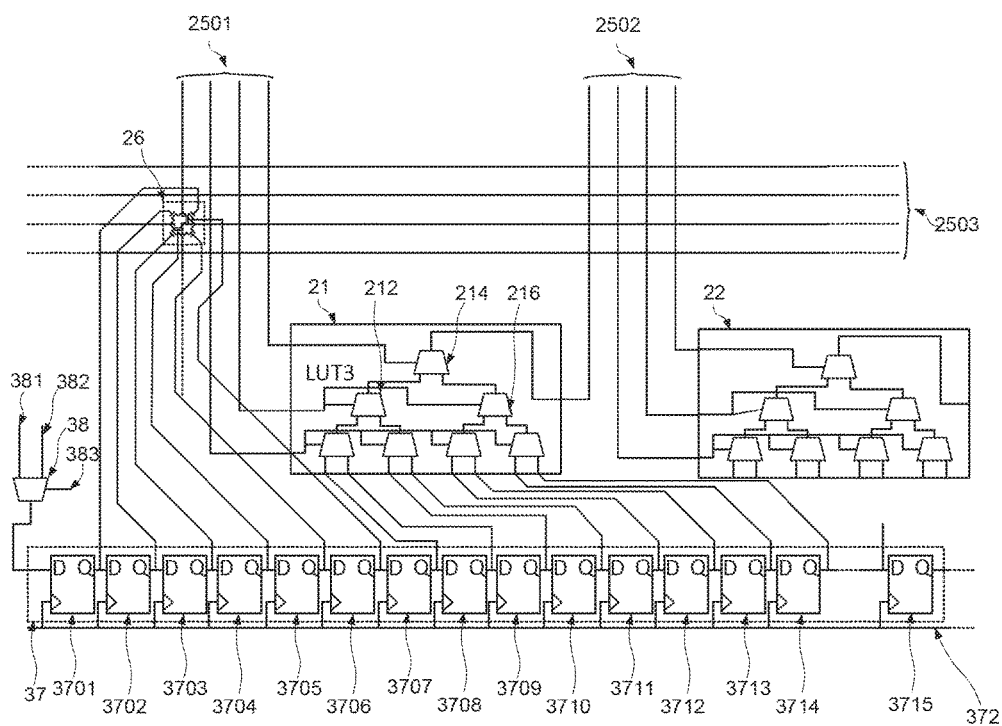
FIG. 3 shows elements of an FPGA system in accordance with an embodiment of the present invention.

FIG. 3 shows elements of an FPGA system in accordance with an embodiment of the present invention.

Figure 1:
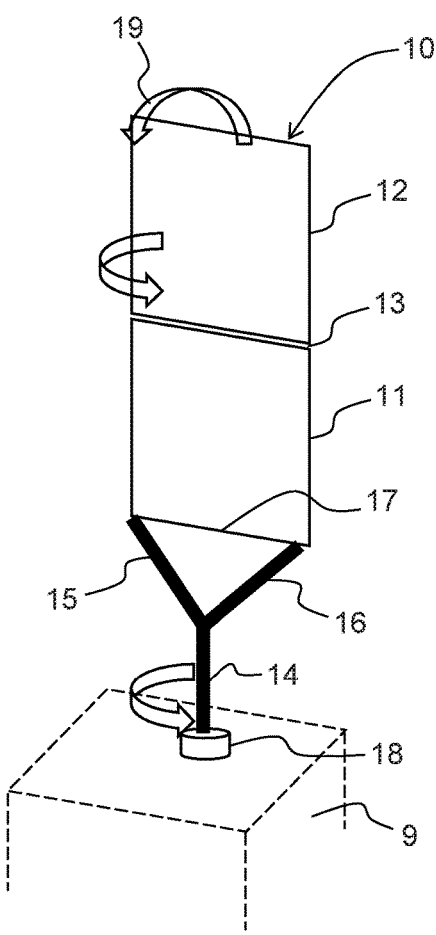
FIG. 1 shows schematically an example of an FPGA system as known in the state of the art.

The elements shown in FIG. 3 constitute a representative example of a partial implementation of parts of the functionality described above with respect to FIG. 1 in accordance with an embodiment of the present invention.

As shown in FIG. 3, there is provided a first Look Up Table (LUT) 21, and a second Look Up Table (LUT) 22, and a number of further LUTs (not shown). The first LUT 21 comprises seven two input multiplexers 211, 212, 213, 214, 215, 216, 217 (reference signs omitted from FIG. 3) respectively. The second LUT and further LUTs are configured similarly. These multiplexers are arranged in a cascading manner with three rows so as to constitute an 8 input multiplexer, the output of which constitutes the output of the LUT. The first row of multiplexers (211, 213, 215 and 217) in each cascade arrangement both have a total of eight inputs. These eight inputs constitute the programming inputs of the first LUT 21. The selection inputs of each row are ganged together, to constitute the three data inputs of the LUT. The data inputs and data output of the first LUT are connected to a set of tracks 2501, 2502. The inputs and outputs of the second and further LUTs are connected correspondingly to a network of further tracks (not shown). Conventionally a LUT with 3 data inputs in this manner is referred to as a "LUT3".

In accordance with this embodiment, each of the eight programming inputs of the first LUT 21 is connected respectively to the Q terminal of a D flip flop 3707, 3708, 3709, 3710, 3711, 3712, 3713, 3714.

Similarly, the configuration inputs of the second LUT 22 and other LUTs provided in the system (not shown) are provided by further D flip flops (not shown). These flip flops are arranged with the flip flops 3707, 3708, 3709, 3710, 3711, 3712, 3713, 3714 to constitute a programming shift register 37, by connecting the output Q of each flipflop to the input D of the next, and ganging together the clock inputs of each flip flop in a single clock line 372. In operation, these memory devices provide a constant predetermined logical value to each of the eight programming inputs of each LUT, in the same way as the SRAM devices described with reference to FIG. 2

During an initiation phase for the circuit, a codeword corresponding to the desired final value of each flip flop in the programming shift register is input to the first flip flop 3701 in the programming shift register bit by bit, and clocked along the programming shift register one bit at a time until the first bit reaches the last flip flop, and the first flip flop receives its final value.

Figure 2:
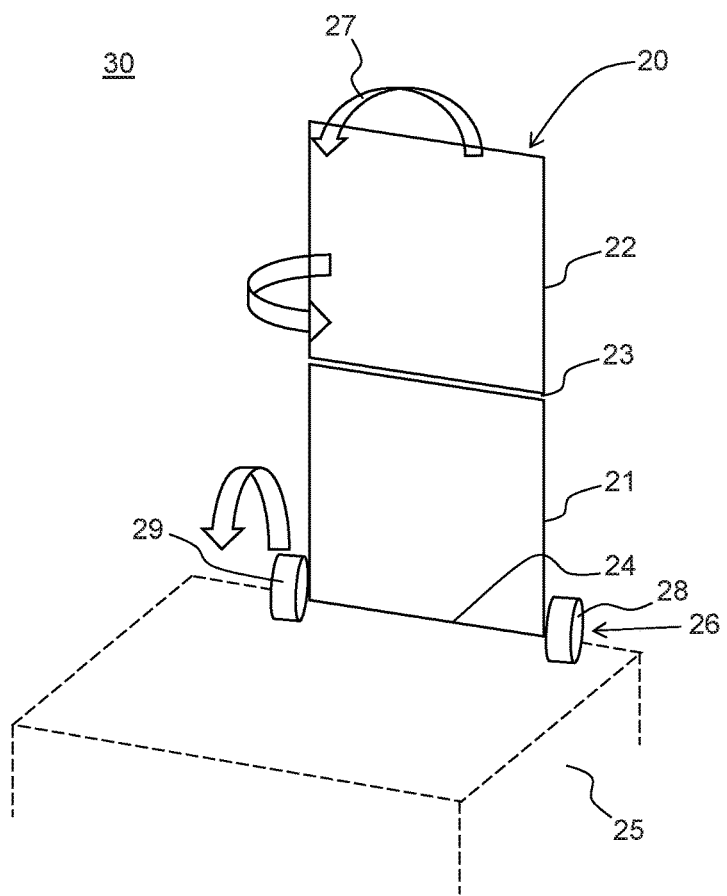
FIG. 2 shows further detail of elements of an FPGA system as known in the state of the art.

The system of FIG. 3 implements an interconnection mechanism similar to that described with respect to FIG. 2 above. In accordance with this embodiment however, each transistor switch of the programmable switch unit 26 is set to be open or closed by a value received from a respective flip flop 3701, 3702, 3703, 3704, 3705, 3706 belonging to the programming shift register 37. Further such programmable switching units, with corresponding flip flops devices are provided at many or all intersection of tracks (not shown). Accordingly, during an initiation phase for the circuit a bitstream corresponding to the desired final value of each flip flop in the programming shift register to implement whatever logic function is required of the FPGA is input to the first flip flop 3701 in the programming shift register bit by bit, and clocked along the programming shift register one bit at a time until the first bit reaches the last flip flop, and the first flip flop receives its final value, thus defining the values of the routing switches and the LUT configuration inputs in one go.

The system of FIG. 3 further comprises a multiplexer 38, switching between two inputs 381 and 382. In accordance with an embodiment, one input 381 may receive a setting stream corresponding to the setting values to be loaded into the programming shift register 37 to implement the FPGA program in use, i.e. any arbitrary bit sequence and may be required by a user, whilst the other multiplexer input 382 may receive a setting stream corresponding to the settings required for the different system components in a test configuration.

Replacing SRAM memory cells with D flip flops implies an increase in transistor count, and accordingly goes against standard IC design imperatives.

By adopting flip flops to control the routing switches and LUT configuration inputs, it becomes possible to implement scan chain test technique without adding extra flip flops specifically for testing purposes. This not only offsets the increase in transistor count mentioned above, but further simplifies the chip design in particular with regard to the routing and control of the test components.

Furthermore, by removing the need for addressing and data busses for a large number of SRAM cells, it is possible to economize substantially in terms of chip area usually set aside for these purposes.

Accordingly, there is disclosed a Field Programmable Gate Array capable of implementing a logic function said Field Programmable Gate Array comprising a plurality of hardware lookup tables, the select lines or outputs of each lookup table being programmably interconnected with the select lines or outputs of another said lookup table by means of a plurality of programmable switches, said Field Programmable Gate Array characterized by further comprising:

a plurality of flip flops in a programming shift register configuration, each said Lookup table having at least one input coupled to an output of a respective said flip flop, and each said programmable switch coupled to an output of a further respective said flip flop; and wherein said Field Programmable Gate Array is arranged to operate in a first mode in which said programming shift register is loaded with predefined test values, and a second mode in which said programming shift register is loaded with values implementing said logic function.

A first flip flop in said programming shift register may be coupled to an input multiplexer, said input multiplexer receiving said predefined test values on a first input and said values implementing said logic function a second input, and responsive to a mode selection signal adapted to feed either said test pattern or said data bitstream to said first flipflop.

While FIG. 3 shows a single programming shift register 37, it will be appreciated that as the proposed mechanism is scaled to incorporate more LUTs and programmable switching units, it may become desirable to implement multiple or multidimensional programming shift registers.

Accordingly, the programming shift register for example as described with reference to FIG. 3 may be one of a plurality of such programming shift registers configured to supply different parts of said Field Programmable Gate Array.

Such a plurality of programming shift registers may be configured to be loaded with the predefined test values in the first mode or said values implementing the logic function in the second mode in parallel or in series.

The skilled person will appreciate that while the system of FIG. 3 has been highly simplified, real systems will be considerably more complex without departing from the principles described herein. In particular, each logic block may comprise more than one LUT, and may further comprise additional logic for example to support extended functionality, or to introduce sequential control. A number of such logic blocks may be arranged together in groups.

Referring back to FIG. 1, it is apparent that while the tracks 14 that provide connectivity between tiles in an operational mode are shown schematically, the address and data busses 23 and 24 are not shown, and in a real device will contribute very substantially to the surface area of the device. The programming shift register arrangement of FIG. 3 addresses this issue, since it becomes possible to load the bitstream for a large number of memory devices into the programming shift register, without needing to individually address each memory cell. This is both simpler in operation, and less demanding in terms of surface area as concerns addressing and bus tracks. It will be appreciated that it may nevertheless not be desirable to provide a single programming shift register incorporating every configuration cell for an entire FPGA device, since such a programming shift register will become unmanageably long, with implications for clock management, power consumption and the like. It is meanwhile possible to adopt an approach based on multiple programming shift registers, which each programming shift register managing the configuration settings for a particular part of the chip. The first flip flop in each such programming shift register, or group of programming shift registers, can be addressed in a similar manner to the individual memory cells of FIG. 2, or otherwise. The choice of the length of each programming shift register then becomes a compromise between longer programming shift registers with simpler configuration bit stream distribution on one hand, and shorter programming shift registers with more complex configuration bitstream distribution on the other, which may imply wider busses and or more complex addressing. The optimal compromise in any given case will depend on the semiconductor technology in use, and various characteristics of the FPGA circuit itself.

Figure 4:
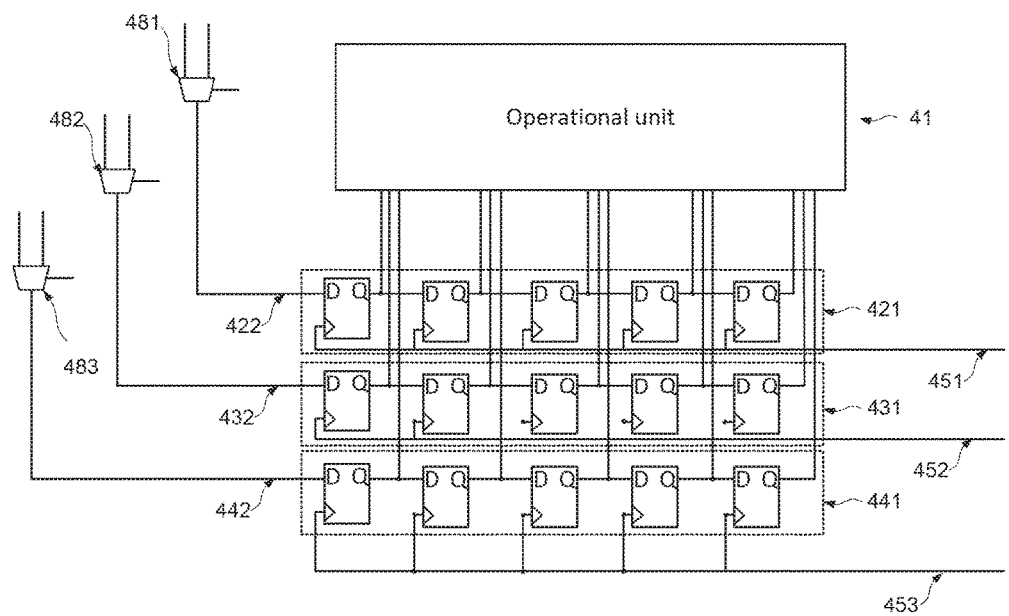
FIG. 4 shows a first configuration for the configuration of FPGA circuitry.

FIG. 4 shows a first configuration for the configuration of FPGA circuitry. As shown, there is provided an operational unit 41 comprising one or more LUTs, possibly with ancillary circuitry and corresponding programmable routing switches, etc. As shown, this operational unit 41 is provided with configuration values by three programming shift registers 421, 431 and 441, receiving input values from three input connections 422, 432, 442, and each having a respective clock 451, 452, 453. The lines 422, 432, 442 each have their own respective input multiplexer 481, 482, 483. Which can be controlled to switch between an operational bitstream or test pattern as described above, for example under software control. In alternative embodiments, a plurality of programming shift registers may receive inputs from a single multiplexer. The output of the multiplexer may be dispatch to the respective programming shift registers by a suitably controlled demultiplexer, or may be addressed for example as explained in the following embodiments.

As shown, the three programming shift registers have only five flip flops, however it will be appreciated that in working implementations the programming shift registers will generally be significantly longer. Working implementations will also generally comprise more than three programming shift registers. The programming shift registers are shown as all comprising the same number of flip flops, however in some cases certain programming shift register may comprise any number of flip flops.

Consideration must be given to the clocking of the different programming shift registers to ensure that the proper value reaches each flip flop. This implies that each programming shift register should receive a number of clock pulses equal to its length and no more, since further pulses would lead to values being clocked onward beyond their proper destination. One approach to this problem is to define all programming shift registers as having the same length as shown in FIG. 4. Alternatively, where shift registers of different lengths are defined, they may be associated with clock management circuitry adapted to ensure that each shift register receives a number of clock signals equal to its length during a the initialization phase. According to a still further approach, each programming shift register may be provided with clock management circuit adapted to recognize a particular bit sequence indicating a particular position in the bitstream intended for that shift register, such as the beginning or end of the bitstream. When the clock manager detects this sequence, it disables the clock entry. This approach has the advantage of making each shift register independent, and leaving the designer the freedom to define programming shift registers of arbitrary size. Alternatively, switching between signals and clocking of programming shift registers may be driven by software.

Figure 5:
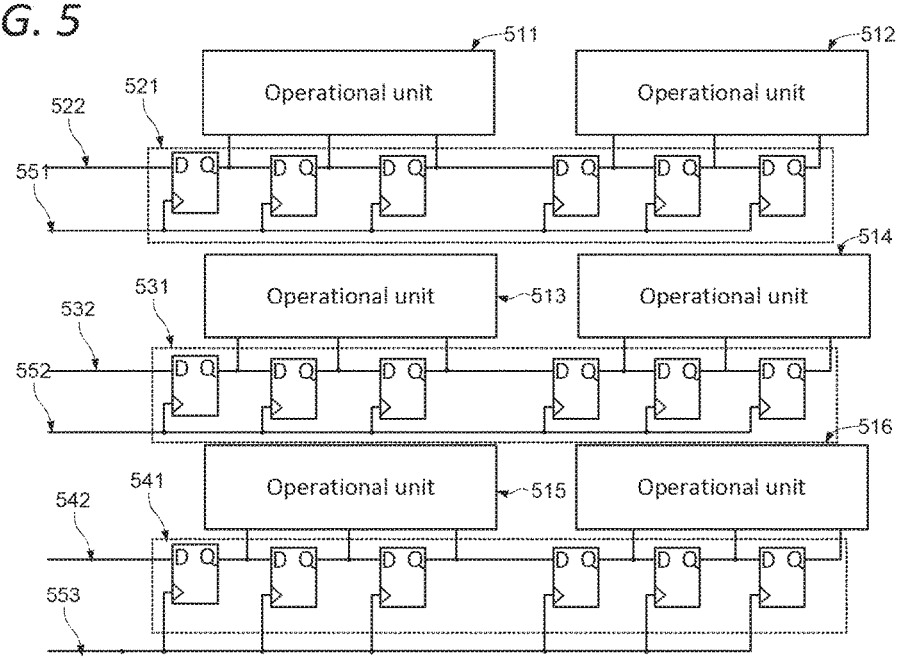
FIG. 5 shows a second configuration for the configuration of FPGA circuitry.

FIG. 5 shows a second configuration for the configuration of FPGA circuitry. As shown in FIG. 5, the FPGA is structured around a matrix of logic blocks 511, 512, 513, 514, 515, 516, in a similar way to the FPGA of FIG. 1. Each row of logic blocks is provided with a respective programming shift register, so that logic blocks 511 and 512 receive configuration values from programming shift register 521, that logic blocks 513 and 514 receive configuration values from programming shift register 531, and logic blocks 515 and 516 receive configuration values from programming shift register 541. As shown, the three programming shift registers each comprise six flip flops, of which three are coupled to each logic block. All of the flip flops in a respective programming shift register have their clock inputs in common, while each programming shift register has its own respective clock 551, 552, 553.

As shown, the three programming shift registers have only six flip flops, however it will be appreciated that in working implementations the programming shift registers will generally be significantly longer. Working implementations will also generally comprise more than three programming shift registers. The programming shift registers are shown as all comprising the same number of flip flops, however in some cases this may be an unacceptable design constraint, in which each programming shift register may comprise any number of flip flops.

Consideration must be given to the clocking of the different programming shift registers to ensure that the proper value reaches each flip flop, in which regard similar measures as discussed above with respect to FIG. 4 are applicable.

The multiplexing between an operational bitstream and test pattern may be implemented for example as described with regard to the foregoing embodiments. The distribution of the operational bitstream or test pattern, and respectively clock signals, may be distributed among programming shift registers for example as described with regard to the foregoing embodiments.

By implementing a direct structural correspondence between the programming shift register architecture and the layout of the logic blocks, a structured approach to the generation of the configuration bitstream is imposed, which is likely to facilitate programming of the FPGA.

Figure 6:
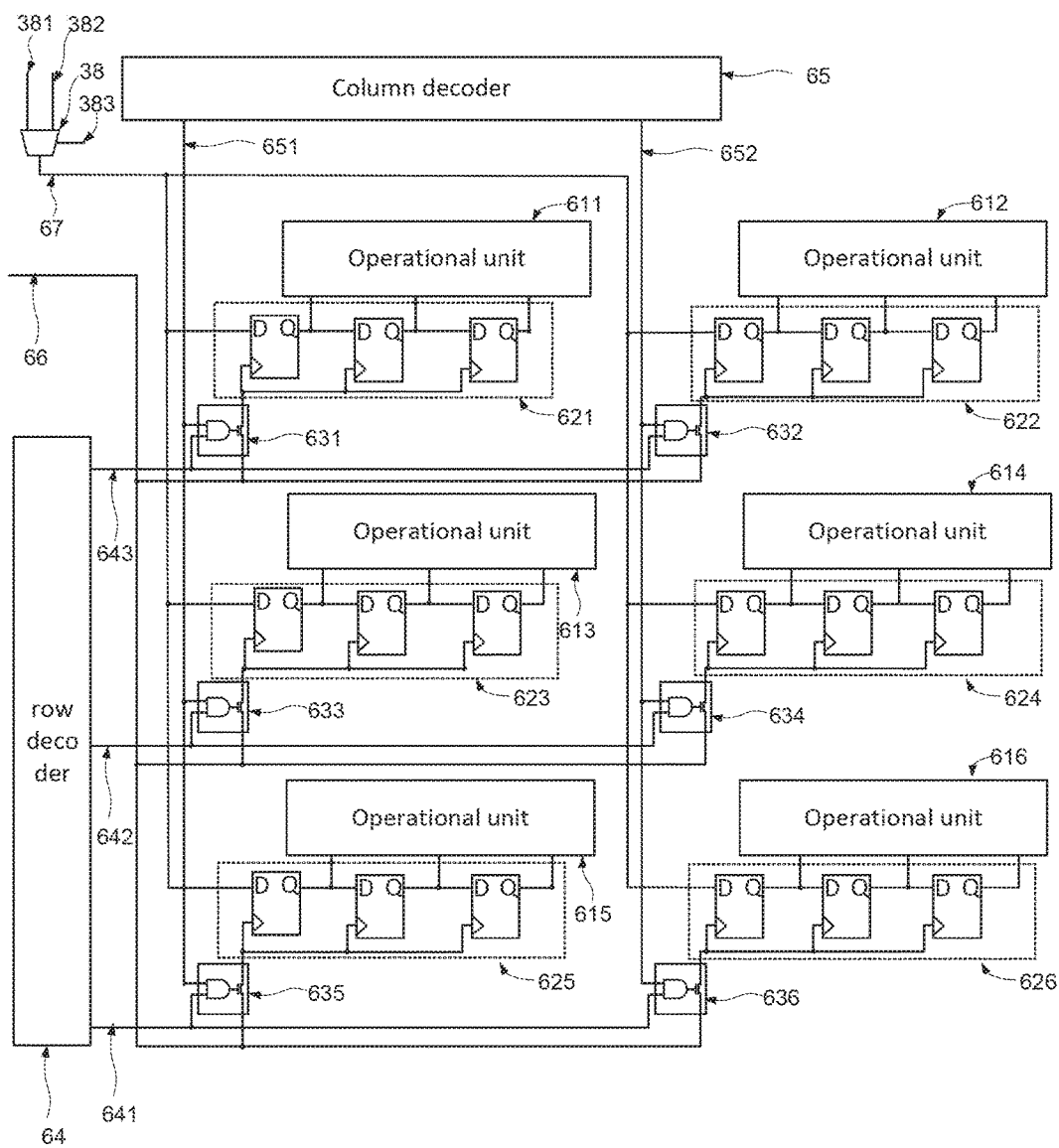
FIG. 6 shows a third configuration for the configuration of FPGA circuitry.

FIG. 6 shows a second configuration for the configuration of FPGA circuitry. As shown in FIG. 6, the FPGA is structured around a matrix of logic blocks 611, 612, 613, 614, 615, 616, in a similar way to the FPGA of FIG. 5. Each logic block is provided with a respective programming shift register 621, 622, 623, 624, 625, 626. As shown, the six programming shift registers 621, 622, 623, 624, 625, 626 each comprise three flip flops, providing configuration values for their associated logic block.

The first flip flop of each programming shift register receives its input on an input line 67, which is coupled in common to the D input of the first flip-flop of each programming shift register.

All of the flip flops in each programming shift register have their clock inputs in common.

A single clock distribution network 66 is coupled to the clock line of each programming shift register by a respective clock gate 631, 632, 633, 634, 635, 636. These clock gates as shown each have a row select and a column select input, whereby concurrent logical highs on both inputs close a switch connecting the clock line of the respective programming shift register to the clock distribution network 66 to receive clock pulses.

As shown there are 2 column select lines 651 and 652, and 3 row lines 641, 642, 643. The select inputs of each clock gate is connected to a respectively different combination of column select line and row select line, so that by setting a particular column select line and row select line to a logical high, the single clock gate having its row select input and a column select input connected to those two select lines will be activated.

Since data values from the input line will only be propagated through a programming shift register when that receives clock inputs, by directing the clock signal to one selected programming shift register it is possible to selectively program any programming shift register with a single input line 67.

The column select lines 651, 652 are controlled by a column decoder 65, and the row select lines 641, 642, 643 are controlled by a row decoder 64. These decoders receive instructions coordinated with the values on the input line 67 to address the value on the input line 67 to whichever programming shift register it is intended for. As such, during an initialization phase the circuit of FIG. 6 will receive not only the configuration bitstream on line 67 and the clock on line 66, but also an addressing bitstream at the decoders 64 and 65.

The fact that only the subset of flip flops, i.e. those belonging to the logic blocks being programmed at a given time are clocked, results in significant reduction in power consumption.

It will be appreciated that in real systems implemented in an FPGA, many logic blocks will be configured identically to implement common functions. It is an advantage of the present invention that it may be possible to enable the clock gate of more than one programming shift register so that the same configuration values can be clocked into several programming shift registers in parallel. This reduces the initialization time of the FPGA, and reduces power consumption.

As shown, the three programming shift registers have only three flip flops, however it will be appreciated that in working implementations the programming shift registers will generally be significantly longer. Working implementations will also generally comprise more than six logic blocks and correspondingly more than six programming shift registers. The programming shift registers are shown as all comprising the same number of flip flops, however since each programming shift register is clocked independently the approach of FIG. 6 is equally well suited to arrangements in which each programming shift register may comprise any number of flip flops.

This addressing functionality may also be implemented by means of standard integrated clock gating cells, or otherwise. Certain embodiments may provide for common enablement of a group of or all programming shift registers together with individual addressing.

By implementing a direct structural correspondence between the programming shift register architecture and the layout of the logic blocks, a structured approach to the generation of the configuration bitstream is imposed, which is likely to facilitate programming of the FPGA.

It will be appreciated that a given FPGA may be subdivided into sections which are programmed independently, and that combinations of various programming shift register architectures for example as described with regard to FIGS. 4, 5 and 6 are possible in the same FPGA with respect to different parts thereof.

In some applications it will be desirable to read back the configuration settings stored in the various configuration memory cells. Although in principle these may be expected to be identical to the configuration bitstream provided at system initialization, in practice there are certain circumstances where this may not be the case. For example exposure to ionizing radiation as may occur in outer space, high altitude flight, nuclear power and military applications, which may modify the values in configuration memory cells in a random manner, falsifying the results of subsequent processing by the FPGA. Comparing the original bitstream with the stored values read out of the configuration memory bits provides a means for determining whether this may have occurred.

As such, there is disclosed a Field Programmable Gate Array comprising an addressing system whereby any of said plurality of programming shift registers may be individually addressed in order to be loaded with said predefined test values in said first mode or said values implementing said logic function in said second mode.

Furthermore, this addressing system may comprise a respective addressable clock gate associated with each programming shift register, this clock gate being adapted to provide a clock signal to the programming shift register with which it is associated when thus addressed.

Figure 7:
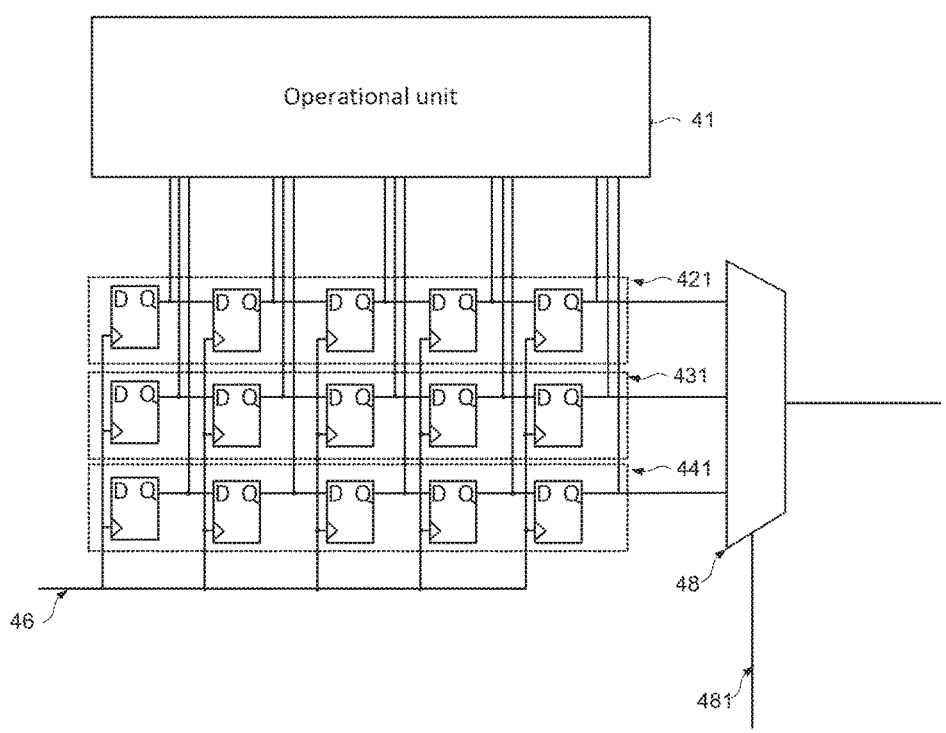
FIG. 7 shows a modification of the structure of FIG. 4 adapted for configuration readout.

FIG. 7 shows a modification of the structure of FIG. 4 adapted for configuration readout. As shown in FIG. 7, there are provided the same operation unit 41, associated with the same programming shift registers 421, 431, 441 as described with reference to FIG. 4. As shown, the last flip flop in each of the three programming shift registers provides its output not only to components of the FPGA circuitry 41, but also to a multiplexer 48. The multiplexer 48 thus receives inputs from the last flip flop of each of the three programming shift registers 421, 431, 441.

In operation, once the processing phase of the FPGA is complete and results have been produced, it may be desired to dump the configuration of the configuration flip flops to ensure consistency with the original bitstream as discussed above. Where this is required, the programming shift registers are clocked via the clock line 46, and the output of each programming shift register sampled by the multiplexer 48 to produce a multiplexed bitstream which ordinarily should be identical to the original configuration bitstream. The selection signal 481 to the multiplier may simply cause a round-robin selection of the three inputs at three times the clock frequency on clock line 46, or may comprise a programmed sequence specific to each clock pulse, for example where the programming shift registers are of different lengths.

It will be appreciated that the approach of FIG. 7 is easily adaptable to structure of FIG. 5.

Figure 8:
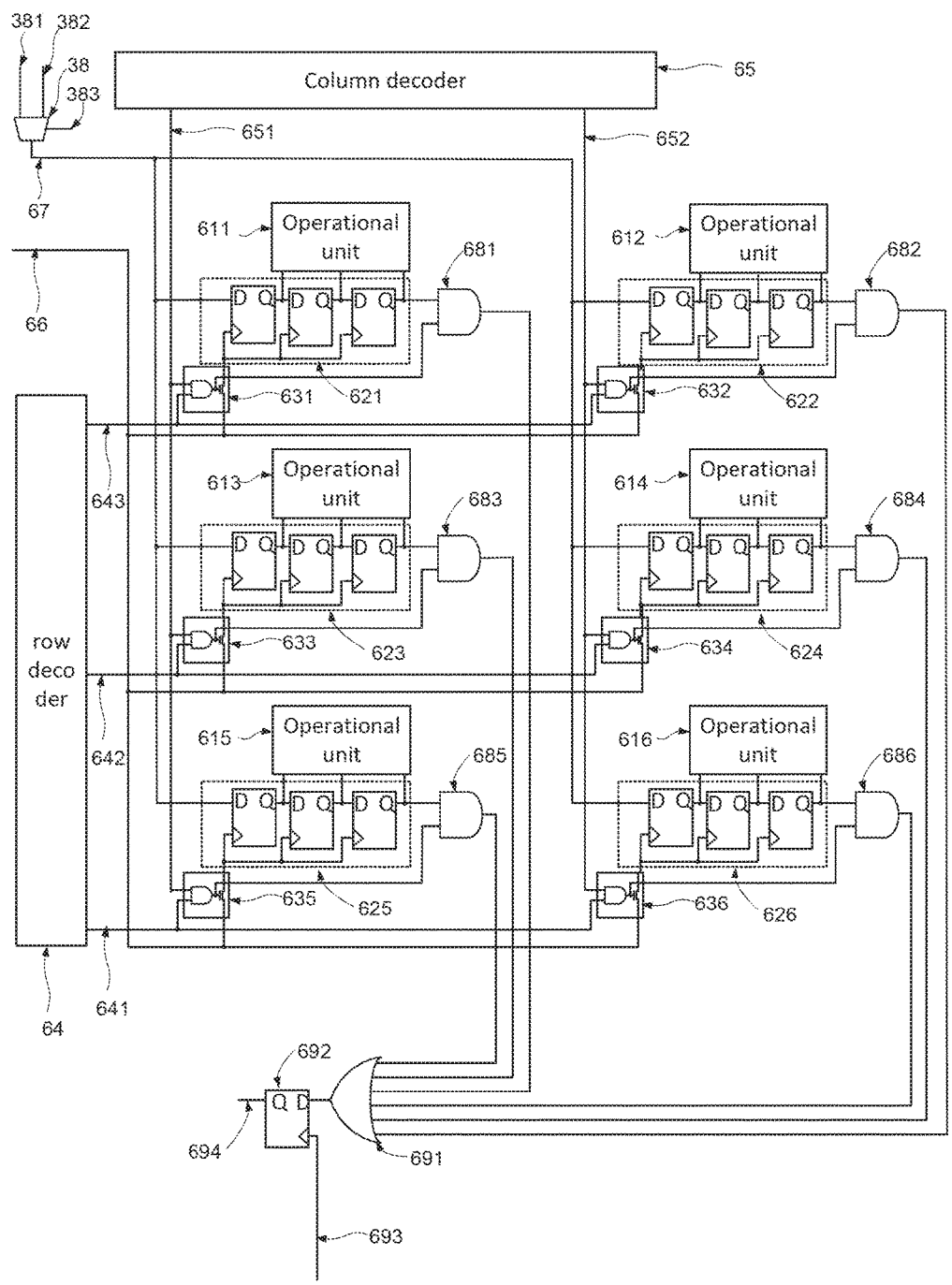
FIG. 8 shows a modification of the structure of FIG. 6 adapted for configuration readout.

FIG. 8 shows a modification of the structure of FIG. 6 adapted for configuration readout. As shown in FIG. 8, the FPGA is structured around the same matrix of logic blocks 611, 612, 613, 614, 615, 616, each logic block is provided with a respective programming shift register 621, 622, 623, 624, 625, 626 and clock gates 631, 632, 633, 634, 635, 636 as described with regard to FIG. 6. As shown the structure further comprises six AND gates 681, 682, 683, 684, 685, 686, each having one input connected to the output of the last flip flop of a respective one of the six programming shift registers 621, 622, 623, 624, 625, 626. The second inputs of each of the six AND gates 681, 682, 683, 684, 685, 686 each connected to the output of the AND gate of the respective clock gate 631, 632, 633, 634, 635, 636. By this means, the addressable clock enable mechanism can also be used to selectively enable an operation unit for output The outputs of the six AND gates are each connected to respective inputs of a six input OR gate 691, the output of which feeds into the D input of an output flip flop 692.

In operation, once the operational phase of the FPGA is complete and results have been produced, it may be desired to dump the configuration of the configuration flip flops to ensure consistency with the original bitstream as discussed above. Where this is required, the enable line is set to logical high, so that the selected AND gate pass the value on the output of the last flip flop of each programming shift register to the OR gate 691. The clock gate of whichever programming shift register's values is to be output is enabled via the row decoder 64 and column decoder 65 in the same way as for configuration bitstream input described above, and a first clock pulse reaches the selected programming shift register. If the last flip flop in the clocked programming shift register produces a logical high, this causes the respective AND gate receiving the value to output a logical high, which is passed by the OR gate 691 to the D input of the output flip flop 692, and stored there until the output flip flop receives a clock pulse on input 693, whereupon the value is output on line 684. By this means, through enabling output on via the clock gate as described above, clocking the programming shift registers and output flip flop in a coordinated manner, the stored values in each configuration programming shift register can be read out and compared to the original bitstream.

Accordingly, the Field Programmable Gate Array may further be adapted to implement a third mode of operation in which values implementing the logic function loaded into the programming shift registers in the second mode of operation are read back out of said programming shift registers.

It will be understood that certain embodiments may be described in terms of a series of method steps for programming an FPGA.

While the foregoing generally describes programming shift registers dedicated to either routing switches or LUT configuration, it will be appreciated that any flip flop in any programming shift register may be coupled to any FPGA element as required.

Figure 9:
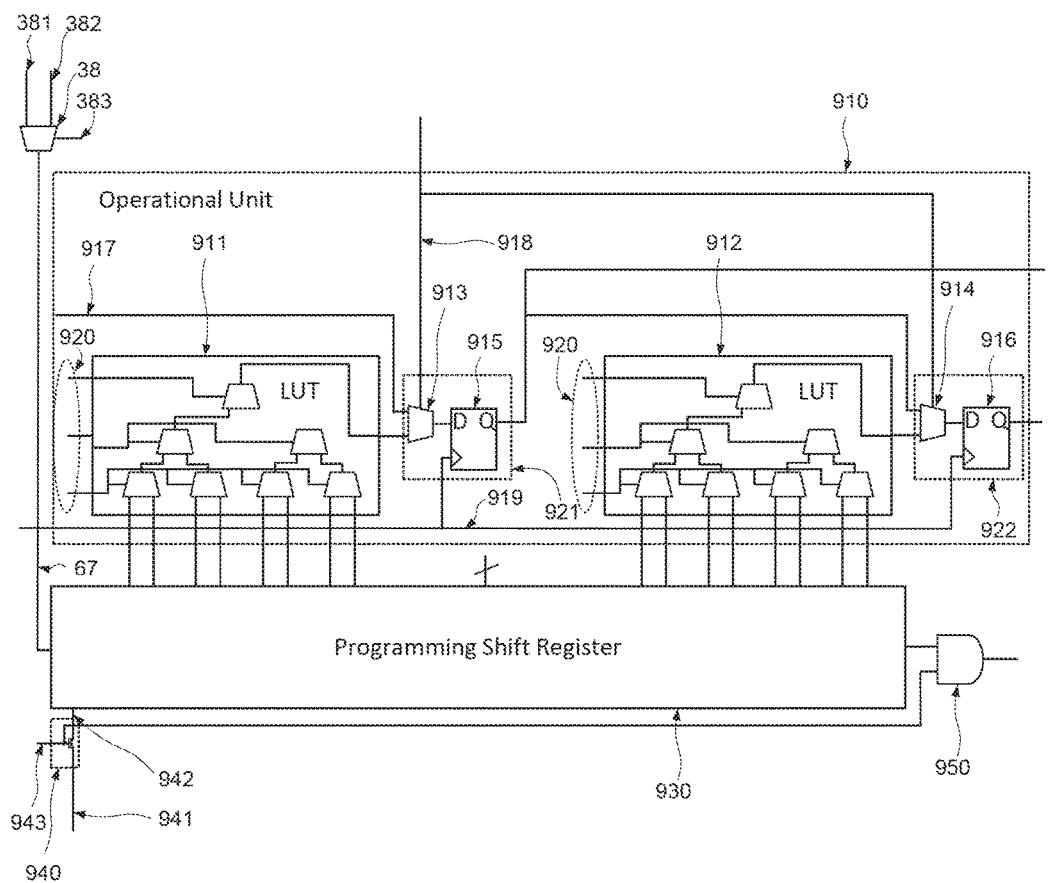
FIG. 9 shows further detail of an operational unit in accordance with a further embodiment.

FIG. 9 shows further detail of an operational unit in accordance with a further embodiment.

As shown in FIG. 9, there is provided an operational unit 910 corresponding to the operational units registers for example as described with reference to the foregoing embodiments. This operational unit 910 comprises two LUTs 911 and 912. The output of each LUT 911, 912 is connected to a respective multiplexer 913, 914. The output of these multiplexers 913, 914 is connected to a respective flip flop 915, 616. Together, a respective multiplexer 913, 914 and a respective flipflop 915, 916, constitute a respective dual configuration LUT flip flop 921, 922. The second input of the multiplexer 913 is connected to a test value input line 917. The second input of the multiplexer 914 is connected to the output of the LUT flip flop 916. The selection inputs of the two multiplexers 913, 914 are connected in common to a test mode selection line 918. The output of each LUT flip flop 915, 916 supply an output line of the operational unit 910. The two LUT flip flops 915, 916 are driven by a common clock line 919. Each of the LUTs 911, 912 has three data inputs, which together constitute 6 data inputs 920 of the operational unit. There is further provided a programming shift register 930, corresponding to the programming shift registers for example as described with reference to the foregoing embodiments. The programming shift register provides configuration values for the LUTs 911, 912, and a number of programmable routing switches (not shown) substantially as described with reference to the foregoing embodiments. A clock 941 is selectively connected to the clock line 942 of the programming shift register 930 by a clock gate 940. The clock gates 940 as shown has enable input, whereby a logical high closes a switch connecting the clock line of the programming shift register to the clock 941 to receive clock pulses. The clock enable input 943 is also connected to one input of a programming output AND gate 950, the other input of the AND gate 950 being connected to the output of the last flip flop in the programming shift register 930. The first flip flop of the programming shift register constitutes the data input 67 of the programming shift register. It will be appreciated that the operational unit may comprise any number of LUTs, that these LUTs may have any number of inputs, and that regardless of the number of inputs, the LUTs may have a plurality of outputs, some or all of which may be associated with LUT flip flops. As described above, when the multiplexer 913 (and 914) receives a suitable select input the two LUT flips flops 915, 916 (referred to as a test mode) constitute a LUT shift register. This shift register may comprise any number of LUT flip flops, including a flip flops in different operational units. Any of the various configurations described with regard to the foregoing embodiments are equally adaptable to the arrangement of FIG. 9.

In operation, this arrangement supports a method of testing an FPGA as described with reference to FIG. 10.

Figure 10:
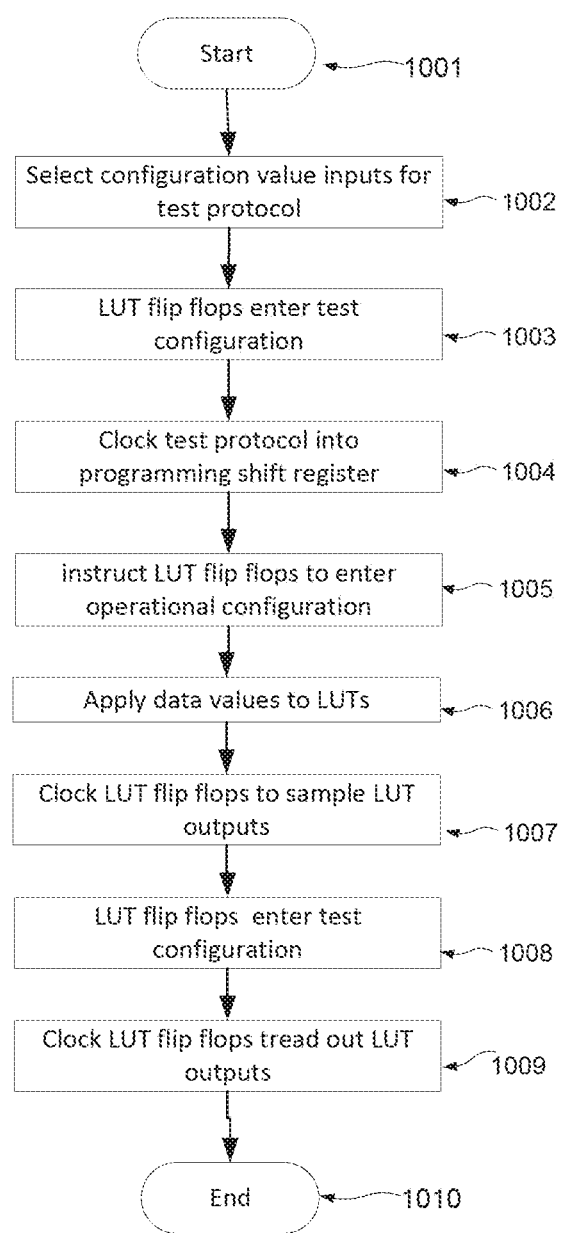
FIG. 10 shows a method of loading an FPGA in accordance with an embodiment.

FIG. 10 shows a method of loading an FPGA in accordance with an embodiment.

As shown in FIG. 10, there is provided a method of operating an FPGA comprising the following steps. The method starts at step 1001 and proceeds to step 1002 of instructing a multiplexer 38 having an output coupled to a programming shift register 930 to select an input 381 receiving configuration values implementing a test protocol.

At step 1003, instructing a plurality of LUT flip flops 921, 922 to enter an test configuration wherein each said LUT flip flop receives inputs implementing said test protocol, and wherein said LUT flip flops are connected as a LUT shift register.

At step 1004, clocking said programming shift register 930 to load a first set of elements thereof with LUT configuration values belonging to said configuration values implementing said test protocol; and clocking said programming shift register to load a second set of elements of said shift register with routing switch Configuration belonging to said configuration values implementing said test protocol.

It will be understood that the first set of shift register elements and second set of shift register elements may be interspersed in the same shift register. Loading values into the shift register will involve clocking the shift register to move the relevant configuration values to their desired final position. In some cases it may be necessary to address the shift register to which values are to be loaded. It may be desirable to load values into a plurality of shift registers in parallel or in series, in which case the method may iterate between a plurality of shift registers before proceeding to the next step.

At step 1005, instructing said plurality of LUT flip flops 921, 922 to enter an operational configuration wherein each said LUT flip flop 921, 922 receives inputs from the outputs of a plurality of LUTs respectively.

At step 1006, applying data values to said plurality of LUTs (on inputs 920).

At step 1007, clocking said LUT flip flops to sample the outputs of each said LUT into a respective said flip flop, said outputs being responsive to said test protocol and said data inputs.

At step 1008 instructing said LUT flip flops to enter a test configuration in which said LUT flip flops are connected in a LUT shift register, and connected as a shift register, and At step 1009, clocking said LUT flipflops to read out the values of said LUT shift register comprising said outputs of said LUTs responsive to said test protocol and said data inputs, and terminates at step 1010.

Once test values are loaded, the behaviour of the FPGA will be assessed to confirm compliance with expectations. The details of this test procedure will depend on the nature of the FPGA system itself and are outside the scope of the present invention.

Generally speaking, the test mode described above is only used in a factory setting, to ensure that the FPGA is fully functional after manufacture.

In some embodiments, a plurality of test protocols may be defined, in which case the forgoing steps may be iterated a plurality of times, each iteration loading a different test protocol in sequence.

In operation, the arrangement of FIG. 9 further supports a method of operating an FPGA as described with reference to FIG. 11.

Figure 11:
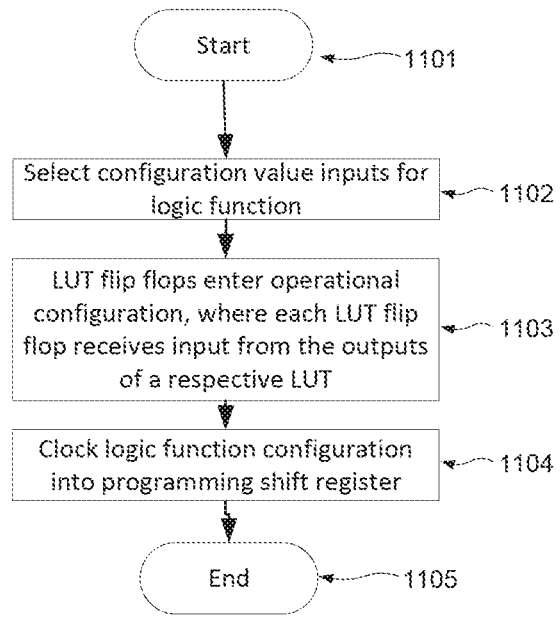
FIG. 11 shows a method of operating an FPGA in accordance with an embodiment.

FIG. 11 shows a method of operating an FPGA in accordance with an embodiment.

As shown in FIG. 11, there is provided a method of operating an FPGA comprising the following steps. The method starts at step 1101, and proceeds to step 1102 of instructing a multiplexer having an output coupled to a programming flip flop to select an input receiving configuration values implementing a logic function.

At step 1103, instructing a plurality of LUT flip flops to enter an operational configuration wherein each said LUT flip flop receives inputs from the outputs of a plurality of LUTs respectively.

At step 1104, clocking said programming shift register to load a first set of elements thereof with LUT Configuration values belonging to said configuration values implementing said logic function; and clocking said programming shift register to load a second set of elements of said shift register with routing switch configuration belonging to said configuration values implementing said logic function, and terminates at step 1105.

In accordance with a development of the embodiment of FIG. 11, the method may comprise the additional steps of enabling the output of a first programming shift register from a plurality of programming shift registers, implementing the steps of FIG. 11 with respect to the first programming shift register, and then repeating these steps for each of said plurality of shift registers.

In operation, the arrangement of FIG. 9 further supports a method of verifying an FPGA. This method may comprise the steps of clocking said first programming shift register to read out a first set of elements thereof with said LUT Configuration values implementing a logic function; and clocking said first programming shift register to read out a second set of elements of said shift register with routing switch Configuration implementing a logic function.

In accordance with a development of this embodiment, the method may comprise the additional steps of enabling the output of a first programming shift register from a plurality of programming shift registers, implementing the describe above with respect to the first programming shift register, and then repeating these steps for each of said plurality of shift registers.

Figure 12:
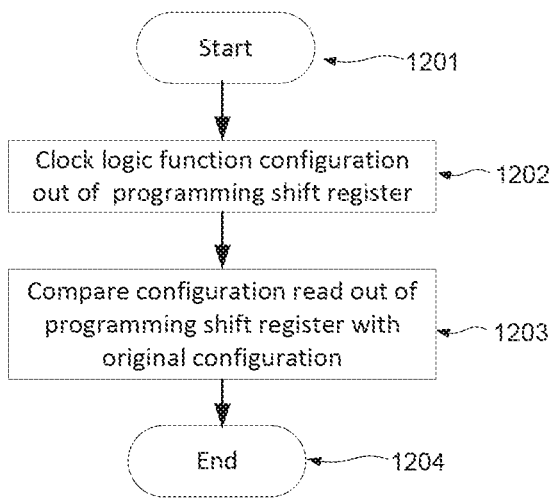
FIG. 12 shows a method of verifying an FPGA in accordance with a further embodiment.

FIG. 12 shows a method of verifying an FPGA in accordance with a further embodiment.

The embodiment of FIG. 12 is a development of the preceding embodiment.

As shown in FIG. 12, there is provided a method of operating an FPGA comprising the following steps. The method starts at step 1201, and proceeds to step 1202 of clocking said first programming shift register to read out a first set of elements thereof with said LUT Configuration values implementing a logic function and clocking said first programming shift register to read out a second set of elements of said shift register with routing switch Configuration implementing a logic function. The method then proceeds to step 1203 of comparing the LUT Configuration implementing a logic function and routing switch Configuration implementing a logic function as read out of said shift register with a LUT Configuration implementing a logic function and routing switch Configuration implementing a logic function as originally read into said shift register, for example in accordance with the method described with reference to FIG. 11. The method then terminates at step 1204.

In ordinary circumstances, it is expected that the bitstream loaded into the shift register should be identical to that read from the shift register. In a case where the two are found to be identical the operational state of the FPGA, and the corresponding results can be deemed to be verified. In a case where the bitstream loaded into the shift register is not identical to that read from the shift register, some or all of the result must be considered to be unsound.

It will be appreciated that different combinations of the steps described with reference to FIGS. 10, 11 and 12 may constitute embodiments of the invention.

In many cases some or all of the method steps may be implemented by means of a computer programming, interfacing with the FPGA and providing suitable bitstreams as described above during the test, operational and verification modes of operation. In some cases some or all of this functionality may be implemented on the same chip as the FPGA, or be performed by part of a larger system to which the FPGA belongs. In other cases, this functionality may be provided by a test or verification system to which the FPGA is temporarily coupled for the purposes of testing after manufacture, or verification after generating suspicious results or exposure to error inducing conditions.

In some embodiments, the methods and processes described herein may be implemented in whole or part by a computing device. These methods and processes may be implemented by means of computer-application programs or services, an application-programming interface (API), a library, and/or other computer-program product, or any combination of such entities.

Figure 13:
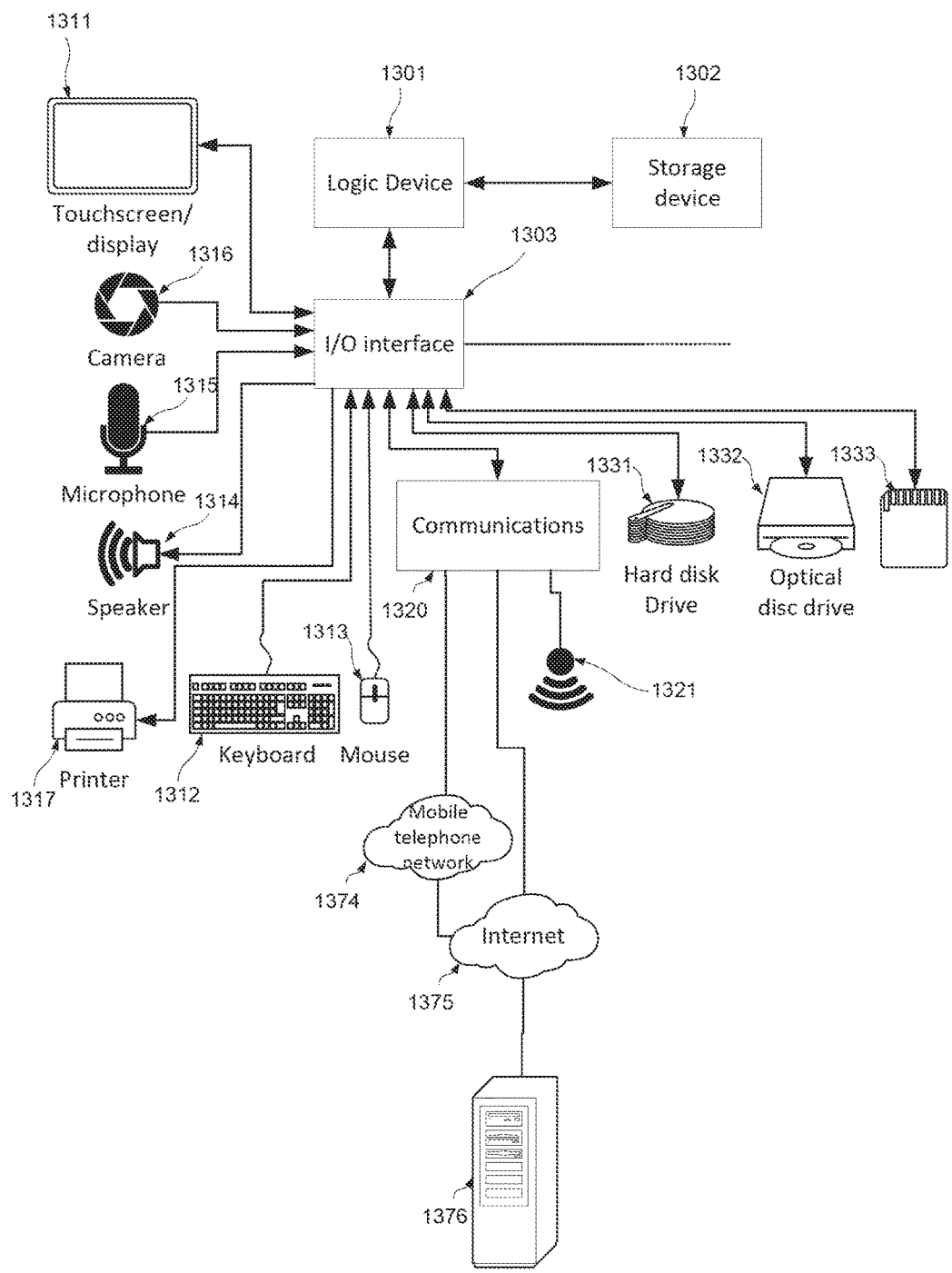
FIG. 13 shows a generic computing system suitable for implementation of embodiments of the invention.

FIG. 13 shows a generic computing system suitable for implementation of embodiments of the invention.

A shown in FIG. 13, a system includes a logic device 1301 and a storage device 1302. The system may optionally include a display subsystem 1311, input subsystem 1312, 1313, 1315, communication subsystem 1320, and/or other components not shown.

Logic device 1301 includes one or more physical devices configured to execute instructions. For example, the logic device 1301 may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic device 1301 may include one or more processors configured to execute software instructions. Additionally or alternatively, the logic device may include one or more hardware or firmware logic devices configured to execute hardware or firmware instructions. Processors of the logic device may be single-core or multi-core, and the instructions executed thereon may be configured for sequential, parallel, and/or distributed processing. Individual components of the logic device 1301 optionally may be distributed among two or more separate devices, which may be remotely located and/or configured for coordinated processing. Aspects of the logic device 1301 may be virtualized and executed by remotely accessible, networked computing devices configured in a cloud-computing configuration.

Storage device 1302 includes one or more physical devices configured to hold instructions executable by the logic device to implement the methods and processes described herein. When such methods and processes are implemented, the state of storage 1302 device may be transformed—e.g., to hold different data.

Storage device 1302 may include removable and/or built-in devices. Storage device 1302 may comprise one or more types of storage device including optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage device may include volatile, nonvolatile, dynamic, static, read/write, read-only, random-access, sequential-access, location-addressable, file-addressable, and/or content-addressable devices.

In certain arrangements, the system may comprise an interface 1303 adapted to support communications between the Logic device 1301 and further system components. For example, additional system components may comprise removable and/or built-in extended storage devices. Extended storage devices may comprise one or more types of storage device including optical memory 1332 (e.g., CD, DVD, HD-DVD, Blu-Ray Disc, etc.), semiconductor memory 1333 (e.g., RAM, EPROM, EEPROM, FLASH etc.), and/or magnetic memory 1331 (e.g., hard-disk drive, floppy-disk drive, tape drive, MRAM, etc.), among others. Such extended storage device may include volatile, non-volatile, dynamic, static, read/write, read-only, random-access, sequential-access, location-addressable, file-addressable, and/or content-addressable devices.

It will be appreciated that storage device includes one or more physical devices, and excludes propagating signals as such. However, aspects of the instructions described herein alternatively may be propagated by a communication medium (e.g., an electromagnetic signal, an optical signal, etc.), as opposed to being stored on a storage device.

Aspects of logic device 1301 and storage device 1302 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The term "program" may be used to describe an aspect of computing system implemented to perform a particular function. In some cases, a program may be instantiated via logic device executing machine-readable instructions held by storage device. It will be understood that different modules may be instantiated from the same application, service, code block, object, library, routine, API, function, etc. Likewise, the same program may be instantiated by different applications, services, code blocks, objects, routines, APIs, functions, etc. The term "program" may encompass individual or groups of executable files, data files, libraries, drivers, scripts, database records, etc.

In particular, the system of FIG. 13 may be used to implement embodiments of the invention.

For example a program implementing the steps described with respect to FIG. 10, 11 or 12 may be stored in storage device 1302 and executed by logic device 1301. The bitstream loaded into the shift register or registers may be generated by the logic device 1301 and/or stored in storage device 1302 or the extended storage devices 1332, 1333 or 1331. The bitstream may be loaded into the shift register or registers by the action of the logic device 1301 via the communications interface 1320. The bitstream read from the shift register or registers may be retrieved by the action of the logic device 1301 via the communications interface 1320, and/or stored in storage device 1302 or the extended storage devices 1332, 1333 or 1331. The Logic device 1301 may retrieve the bitstream loaded to the shift register or registers, and the bitstream read from the shift register or registers in the verification mode, and perform a comparison to determine validity of results.

Accordingly the invention may be embodied in the form of a computer program.

It will be appreciated that a "service", as used herein, is an application program executable across multiple user sessions. A service may be available to one or more system components, programs, and/or other services. In some implementations, a service may run on one or more server-computing devices.

When included, display subsystem 1311 may be used to present a visual representation of data held by storage device. This visual representation may take the form of a graphical user interface (GUI). As the herein described methods and processes change the data held by the storage device 1302, and thus transform the state of the storage device 1302, the state of display subsystem 1311 may likewise be transformed to visually represent changes in the underlying data. Display subsystem 1311 may include one or more display devices utilizing virtually any type of technology. Such display devices may be combined with logic device and/or storage device in a shared enclosure, or such display devices may be peripheral display devices.

When included, input subsystem may comprise or interface with one or more user-input devices such as a keyboard 1312, mouse 1313, touch screen 1311, or game controller (not shown). In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 1320 may be configured to communicatively couple computing system with one or more other computing devices. For example, communication module of may communicatively couple computing device to remote service hosted for example on a remote server 1376 via a network of any size including for example a personal area network, local area network, wide area network, or the internet. Communication subsystem may include wired and/or wireless communication devices compatible with one or more different communication protocols. As non-limiting examples, the communication subsystem may be configured for communication via a wireless telephone network 1374, or a wired or wireless local- or wide-area network. In some embodiments, the communication subsystem may allow computing system to send and/or receive messages to and/or from other devices via a network such as the Internet 1375. The communications subsystem may additionally support short range inductive communications 1321 with passive devices (NFC, RFID etc).

According to certain embodiments, configuration values for Lookup tables (LUTs) and programmable routing switches in an FPGA are provided by means of a number of flip flops arranges in a shift register. This shift register may receive test values in a factory test mode, and operational configuration values (implementing whatever functionality the client requires of the FPGA) in an operational mode. The bitstreams are provided at one end of the shift register, and clocked through until the last flip flop receives its value. Values may also be clocked out at the other end of the shift register to be compared to the initial bitstream in order to identify corruption of stored values e.g. due to radiation exposure. A clock gating architecture is proposed for loading data to or reading data from specific selected shift registers.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A Field Programmable Gate Array capable of implementing a logic function said Field Programmable Gate Array comprising a plurality of hardware lookup tables, the select lines or outputs of each lookup table being programmably interconnected with the select lines or outputs of another said lookup table by means of a plurality of programmable switches said Field Programmable Gate Array further comprising:
a plurality of flip flops in a shift register configuration, each said Lookup table having at least one input coupled to an output of a respective said flip flop, and each said programmable switch coupled to an output of a further respective said flip flop; and
wherein said Field Programmable Gate Array is arranged to operate in a first mode in which said shift register is loaded with predefined test values, and a second mode in which said shift register is loaded with values implementing said logic function.

2. The Field Programmable Gate Array of claim 1 wherein a first flip flop in said shift register is coupled to an input multiplexer, said input multiplexer receiving said predefined test values on a first input and said values implementing said logic function a second input, and responsive to a mode selection signal adapted to feed either said test pattern or said data bitstream to said first flipflop.

3. The Field Programmable Gate Array of claim 1 wherein said shift register is one of a plurality of such shift registers configured to supply different parts of said Field Programmable Gate Array.

4. The Field Programmable Gate Array of claim 3 wherein said plurality of shift registers are configured to be loaded with said predefined test values in said first mode or said values implementing said logic function in said second mode in parallel.

5. The Field Programmable Gate Array of claim 3 wherein said plurality of shift registers are configured to be loaded with said predefined test values in said first mode or said values implementing said logic function in said second mode in series.

6. The Field Programmable Gate Array of claim 3 further comprising an addressing system whereby any of said plurality of shift registers may be individually or by group addressed in order to be loaded with said predefined test values in said first mode or said values implementing said logic function in said second mode.

7. The Field Programmable Gate Array of claim 6 wherein said addressing system comprises a respective addressable clock gate associated with each said shift register, said clock gate being adapted to provide a clock signal to the shift register with which it is associated when thus addressed.

8. The Field Programmable Gate Array of claim 1 further adapted to implement a third mode of operation in which said values implementing said logic function loaded into said shift registers in said second mode of operation are read back out of said shift registers.

* * * * *